United States Patent [19]
Takenaka et al.

[11] Patent Number: 5,889,333
[45] Date of Patent: Mar. 30, 1999

[54] SEMICONDUCTOR DEVICE AND METHOD FOR MANUFACTURING SUCH

[75] Inventors: Masashi Takenaka; Junichi Kasai; Masataka Mizukoshi, all of Kawasaki; Taturou Yamashita, Satsuma-gun, all of Japan

[73] Assignee: Fujitsu Limited, Kanagawa, Japan

[21] Appl. No.: 925,067

[22] Filed: Sep. 8, 1997

Related U.S. Application Data

[63] Continuation of Ser. No. 434,409, May 3, 1995, abandoned.

[30] Foreign Application Priority Data

Aug. 9, 1994 [JP] Japan ..................................... 6-187390

[51] Int. Cl.$^6$ ........................... H01L 23/48; H01L 23/52; H01L 29/40
[52] U.S. Cl. .......................... 257/783; 257/690; 257/737; 257/780
[58] Field of Search ..................................... 257/737, 666, 257/671, 672, 673, 690, 692, 780, 783, 786, 698, 738, 774, 778, 779, 734, 697; 361/813; 437/220; 438/123, 119

[56] References Cited

U.S. PATENT DOCUMENTS

| | | | |
|---|---|---|---|
| 4,530,002 | 7/1985 | Kanai | 257/697 |
| 5,126,818 | 6/1992 | Takami et al. | 257/737 |
| 5,229,646 | 7/1993 | Tsumura | 257/783 |
| 5,302,849 | 4/1994 | Cavasin | 257/696 |
| 5,479,051 | 12/1995 | Waki et al. | 257/787 |

FOREIGN PATENT DOCUMENTS

| | | | |
|---|---|---|---|
| 59-161057 | 9/1984 | Japan | 257/690 |
| 59-181651 | 10/1984 | Japan | 257/693 |
| 62-158352 | 7/1987 | Japan | 257/666 |
| 4-56158 | 2/1992 | Japan | 257/697 |

*Primary Examiner*—Mahshid Saadat
*Assistant Examiner*—Jhihan B. Clark
*Attorney, Agent, or Firm*—Armstrong, Westerman, Hattori, McLeland & Naughton

[57] ABSTRACT

A semiconductor device includes a device body including at least an LSI chip, and a lead structure having a base which is flexible and a plurality of pins which project from both sides of the base. The lead structure is integrated with the device body so that first ends of the plurality of pins are electrically connected to the LSI chip. The semiconductor device is manufactured in accordance with two steps of forming the lead structure and of integrating the lead structure with the deice body so that the first ends of the plurality of pins are electrically connected to the LSI chip.

10 Claims, 16 Drawing Sheets

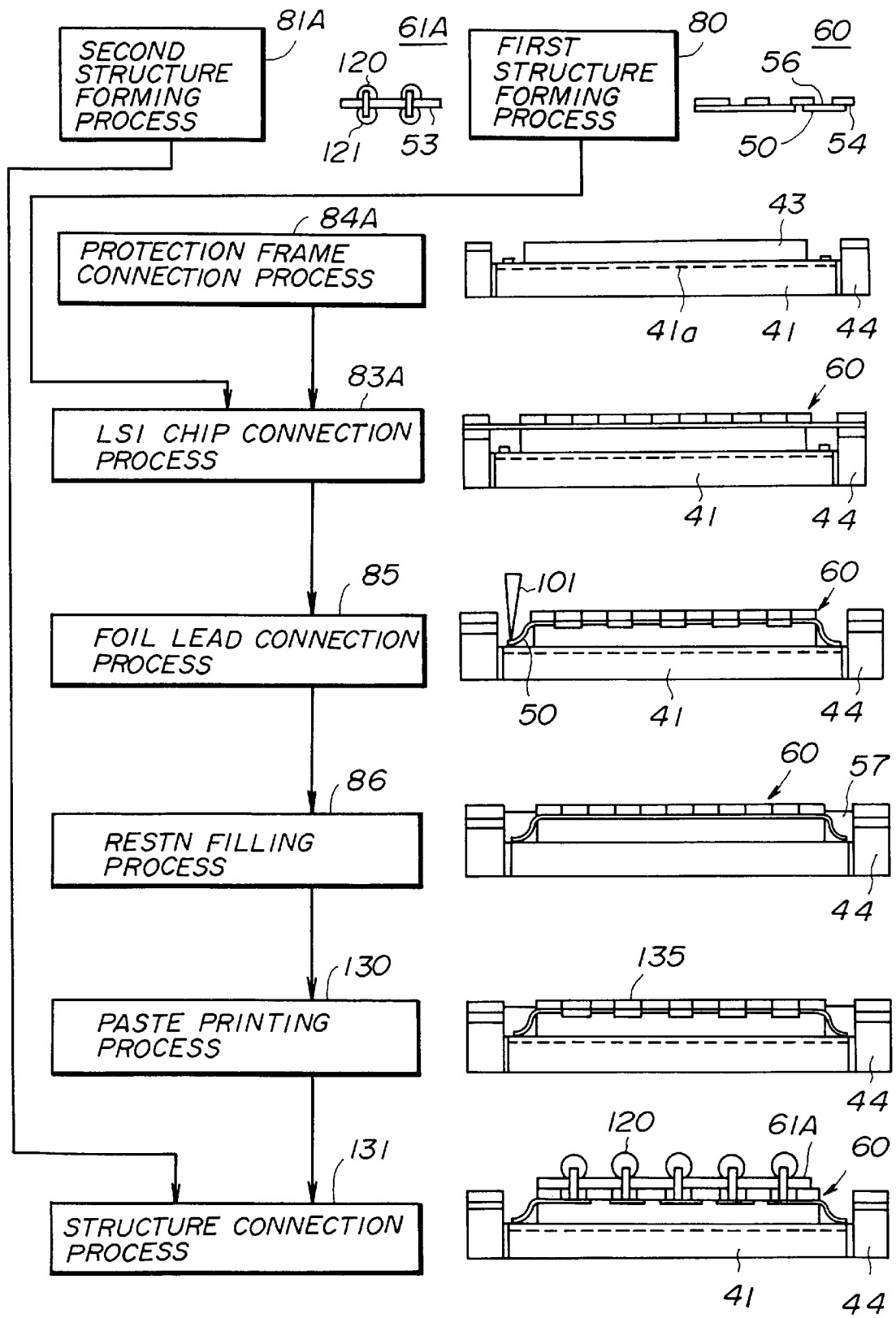

SEMICONDUCTOR DEVICE AND METHOD FOR MANUFACTURING SUCH

This application is a continuation of application Ser. No. 08/434,409 filed May 3, 1995, now abandoned.

BACKGROUND OF THE INVENTION (1) Field of the invention

The present invention generally relates to a semiconductor device and a method for manufacturing such, and more particularly to a micro-semiconductor device and a method for manufacturing such.

(2) Description of the Prior Art

In recent years, to miniaturize electronic equipment it is desired that micro-semiconductor devices which can be mounted on a narrow area have been developed. μBGA (Ball Grid Array) semiconductor devices and CSP (Chip Size Package) semiconductor devices are examples of such micro-semiconductor device.

FIG. 1 shows an example of a conventional micro-semiconductor device 10.

The micro-semiconductor device 10 shown in FIG. 1 is referred to as a μBGA semiconductor device. Referring to FIG. 1, the micro-semiconductor device has a LSI chip 11, a terminal member 12, a square protection frame 13 and an adhesive layer 14. The terminal member 12 has a structure in which a Cu-foil lead 15 is adhered to a polyimide film 16 provided with solder bumps 17. The diameter $d_1$ of each of the solder bumps 17 is about 0.2 mm. The terminal member 12 is adhered to the LSI chip 11 by the adhesive layer 14. The adhesive layer 14 also has function of encapsulating a circuit portion of the LSI chip 11. The protection frame 13 surrounds the LSI chip 11 so as to protect it.

The solder bumps 17 and pads 21 on a printed circuit board 20 are soldered by reflow so that the micro-semiconductor device 10 is mounted on the printed circuit board 20. The area on which the micro-semiconductor device is mounted is substantially equal to a projected area of the LSI chip 11.

The terminal member 12 described above has a structure in which the Cu-foil 15 formed as an internal terminal and the solder bumps 17 formed as external terminals are integrated with each other. The terminal member 12 is manufactured in accordance with steps as shown in FIG. 3 (A), (B) and (C).

First, a Cu-foil 31 is formed on the polyimide film 16 through which holes 30 are formed, as shown in FIG. 3 (A). Second, the Cu-foil 31 is masked and etched so that fine Cu-foil leads 15 are formed as shown in FIG. 3 (B). As a result, an internal terminal member 32 in which the fine Cu-foil leads 15 are stuck on the polyimide film 16 having the holes is obtained.

Last, the internal terminal member 32 is masked and plated with solder so that the solder is connected to the Cu-foil leads 15. The holes formed through the polyimide film 16 are filled with the solder so that the solder projects above the rims of the holes. As a result, the solder bumps 17 are formed.

The conventional micro-semiconductor device as has been described above has the following two disadvantages.

First, the conventional micro-semiconductor device is apt to be defectively mounted on the printed circuit board.

The LSI chip 11 is made of silicon, the coefficient of thermal expansion being $3.5 \times 10^{-6}$. On the other hand, the printed circuit board 20 is made of glass epoxy resin having a coefficient of thermal expansion of $14 \times 10^{-6}$ which is four times as large as that of the LSI chip 11. The diameter $d_1$ of each of the solder bumps 17 is about 0.2 mm which is only one third as large as that of a solder bump of a general BGA semiconductor device, so that each of the solder bumps 17 has limited ability for absorbing stress.

Thus, when there is stress caused by the difference between the coefficients of thermal expansion of the LSI chip 11 and the printed circuit board 20, the stress may be too large to be absorbed by the solder bumps 17. In this case, cracks may be generated in the solder bumps 17, so that the micro-semiconductor device may be defectively mounted on the printed circuit board.

Even if the cracks are not generated in the solder bumps 17, the reliability of the micro-semiconductor device mounted on the printed circuit board 20 is poor.

Second, the production cost of the micro-semiconductor device made in the above manner is high.

The terminal member 12 has the structure in which the Cu-foil leads 15 and the solder bumps 17 are integrated with each other. It is relatively difficult to form the fine Cu-foil leads 15 and the small solder bump 17. Thus, the terminal member 12 is apt to be defectively formed. Further, the yield in the etching step shown in FIG. 3 (B) and the yield in the solder plating step shown in FIG. 3 (C) are poor. The total yield of the terminal member 12 which is obtained by multiplying both the above yields in the etching step and the solder plating step is consequently poor.

As a result, the production cost of the terminal member 12 is high, and the total production cost of the micro-semiconductor device is high.

SUMMARY OF THE INVENTION

Accordingly, a general object of the present invention is to provide a novel and useful semiconductor device and a method for manufacturing the device in which the disadvantages of the aforementioned prior art are eliminated.

A specific object of the present invention is to provide a semiconductor device which is not apt to be defectively mounted on a board.

Another object of the present invention is to provide a semiconductor which can be manufactured at a low cost.

The above objects of the present invention are achieved by a semiconductor device comprising a device body including at least an LSI chip and a lead structure having a base which is flexible and a plurality of pins which project from both sides of the base. The lead structure is integrated with the device body so that first ends of the plurality of pins are electrically connected to the LSI chip.

According to the present invention, the first ends of the plurality of pins electrically connected to the LSI chip are supported by the base which is flexible. Thus, in a case where the second ends of the plurality of pins are bonded to a printed circuit board so that the semiconductor device is mounted on the printed circuit board, stress caused by the difference between coefficients of thermal expansion of the LSI and the printed circuit board can be absorbed by the pins. As a result, cracks are not generated in portions in which the pins and the printed circuit board are connected.

Another object of the present invention is to provide a method for manufacturing the above-described semiconductor device.

The object of the present invention is achieved by a method for manufacturing a semiconductor device comprising the steps of: (a) forming a lead structure having a base which is flexible and a plurality of pins which project from both sides of the base; and b) integrating the lead structure with a device body including at least an LSI chip so that first ends of the plurality of pins are electrically connected to the LSI chip.

According to the present invention, the semiconductor device can be manufactured at a high yield.

BRIEF DESCRIPTION OF THE DRAWINGS

Other objects, features and advantages of the present invention will become apparent from the following detailed description when read in conjunction with the accompanying drawings, in which:

FIG. 11 is a process diagram illustrating a second method for manufacturing the μBGA semiconductor device shown in FIG. 4;

DESCRIPTION OF THE PREFERRED EMBODIMENTS

A description will be given of a first embodiment of the present invention.

Figure 4:
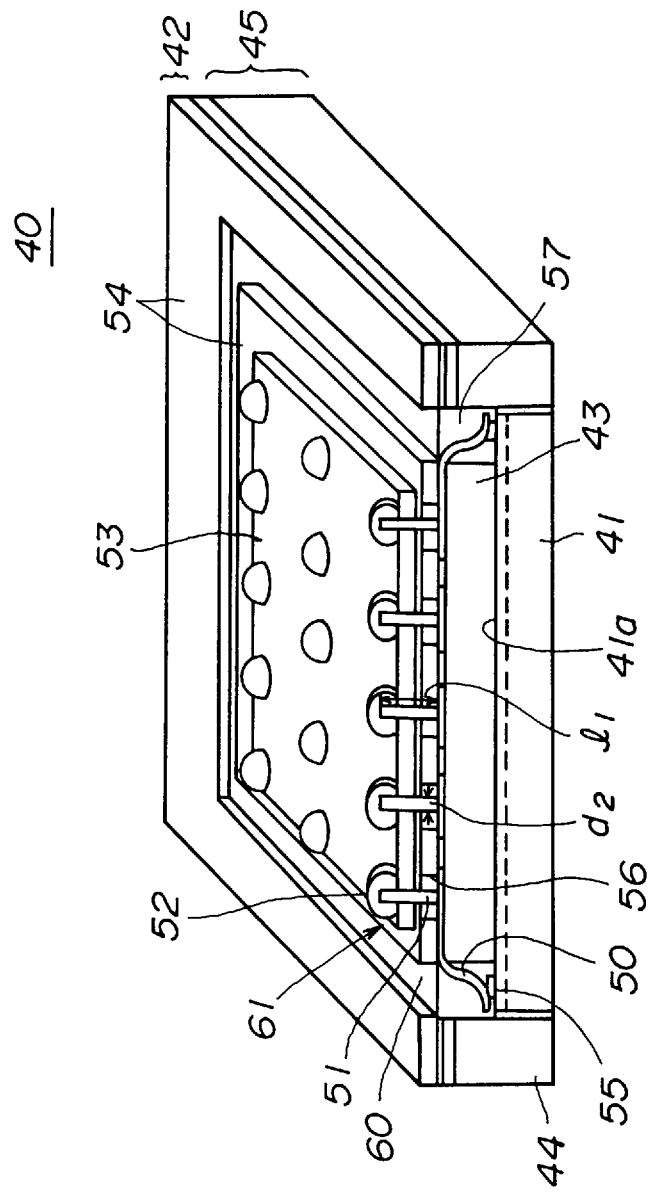
FIG. 4 is a diagram illustrating a structure of an μBGA semi conductor device according to a first embodiment of the present invention.

A semiconductor device according to the first embodiment of the present invention is formed as shown in FIG. 4. This semiconductor device is an μBGA type semiconductor device.

Referring to FIG. 4, the semiconductor device 40 is formed of a semiconductor device body 45 and a lead structure 42. The semiconductor device body 45 has an LSI chip 41 a softened adhesive layer 43 and a protection frame 44. The lead structure 42 has Cu-foil leads (pattern) 50, superfine pins 51 made of Cu, solder bumps 52, a base 53 made of silicon resin and a film 54 made of polyimide resin.

Ends of the Cu-foil leads 50 are connected to pads 55 provided around the LSI chip 41. The Cu-foil leads 50 are provided on the adhesive layer 43 in a predetermined pattern and adhered thereto.

Each of the superfine pins 51 has a diameter $d_2$ of about 0.1 mm and a length 11 of about 1 mm. Bottom ends of the superfine pins 51 are connected to other end portions of the Cu-foil leads 50 so that the superfine pins 51 stand upright. The solder bumps 52 are formed on top ends of the superfine pins 51. As a result, the solder bumps 52 are electrically connected to the pads 55 via the superfine pins 51 and the Cu-foil leads 50.

The Cu-foil leads 50 are formed on the film 54 so as to be supported by the film 54. The film 54 is adhered to the adhesive layer 43 and the protection frame 44. The bottom end of each of the superfine pins 51 is engaged in one of the holes 56 formed on the film 54. The superfine pins 51 pass through the sheet base 53. The base 53 is made of silicon so as to be soft. That is, the base 53 has flexibility.

The base 53 is on the film 54 and supports a large number of superfine pins 51 in a manner such that the superfine pins 51 can be deformed to a certain extent. The adhesive layer 43 also has a function of encapsulating the LSI chip 41. A resin filled portion 57 surrounds the adhesive layer 43, and the pads 55 and a part of the Cu-foils 50 are encapsulated by the resin filled portion 57.

The lead structure 42 has a first structure 60 formed of the Cu-foil leads 50 and the film 54 and a second structure 61 formed of the super fine pins 51, the solder bumps 52 and the base 53.

Figure 5:
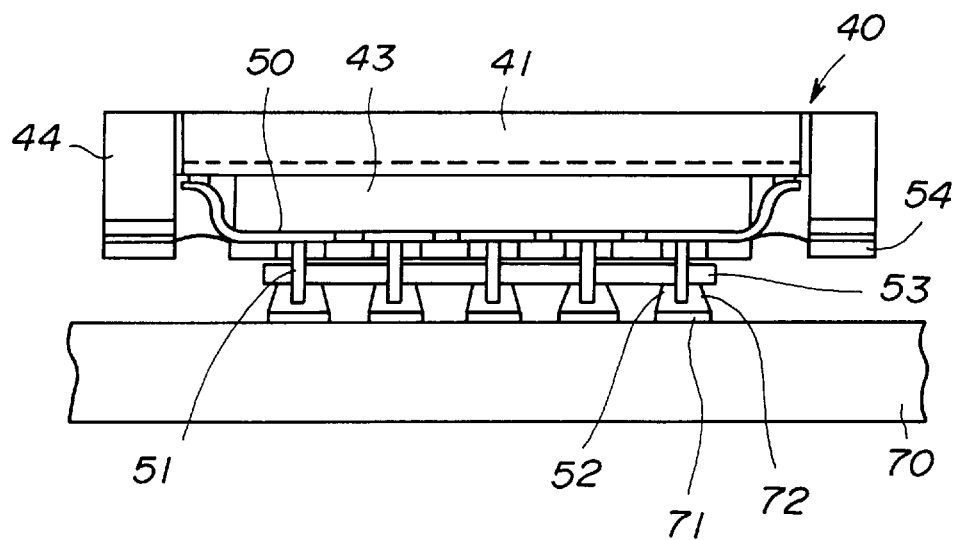
FIG. 5 is a cross-sectional view illustrating the semiconductor device shown in FIG. 4 mounted on a printed circuit board.

As shown in FIG. 5, solder bumps 52 and pads 71 formed on a printed circuit board 70 are soldered by the reflow, so that the μBGA semiconductor device 40 having the above structure is mounted on a narrow area on the printed circuit board 70. In this embodiment, after soldering the μBGA semiconductor device 40, the solder bumps 52 are renamed soldering portions 72.

Figure 6:
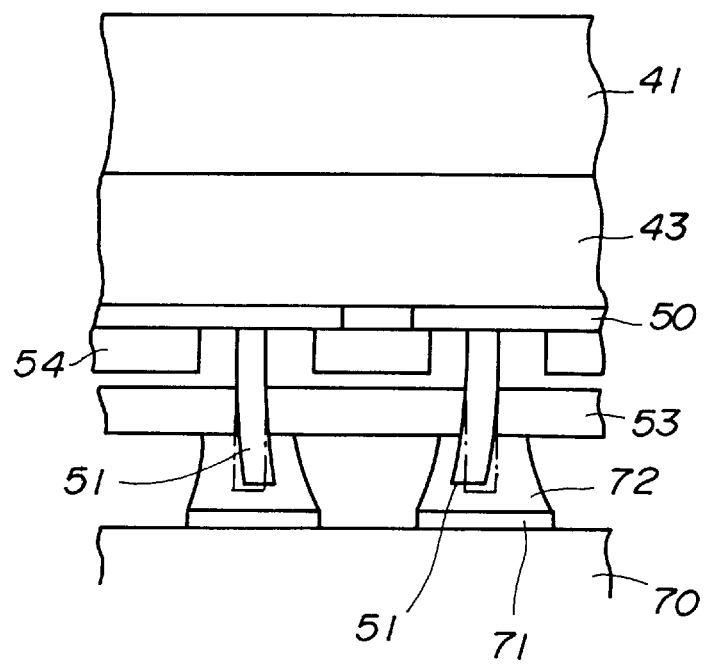
FIG. 6 is a diagram illustrating a state in which stress concentration is avoided in connecting portions between an LSI chip and a printed circuit board.

When the μBGA semiconductor device 40 is mounted on the printed circuit board 70 by soldering, the stress concentration is avoided in the respective soldering portions 72 as shown in FIG. 6.

The printed circuit board 70 contracts to an extent greater than the LSI chip 41 in the soldering process. Referring to FIG. 6, in the contraction of the printed circuit board 70 and the LSI chip 41, each of the superfine pins 51 supported by the sheet type base 53 is bent from a state indicated by a chain line to a state indicated by a continuous line so as to bend the base 53. Due to the bending of the superfine pins 51, the stress caused by the difference between the coefficients of the thermal expansion of the printed circuit board 70 and the LSI chip 41 are absorbed. As a result, the stress concentration in the soldering portions 72 is avoided. Thus, cracks are not generated in the soldering portions 72, and the semiconductor device 40 can be mounted on the printed circuit board 70 so as to provide highly reliable operation.

A description will now be given of methods for manufacturing the semiconductor device 40 shown in FIG. 4.

Figure 7:
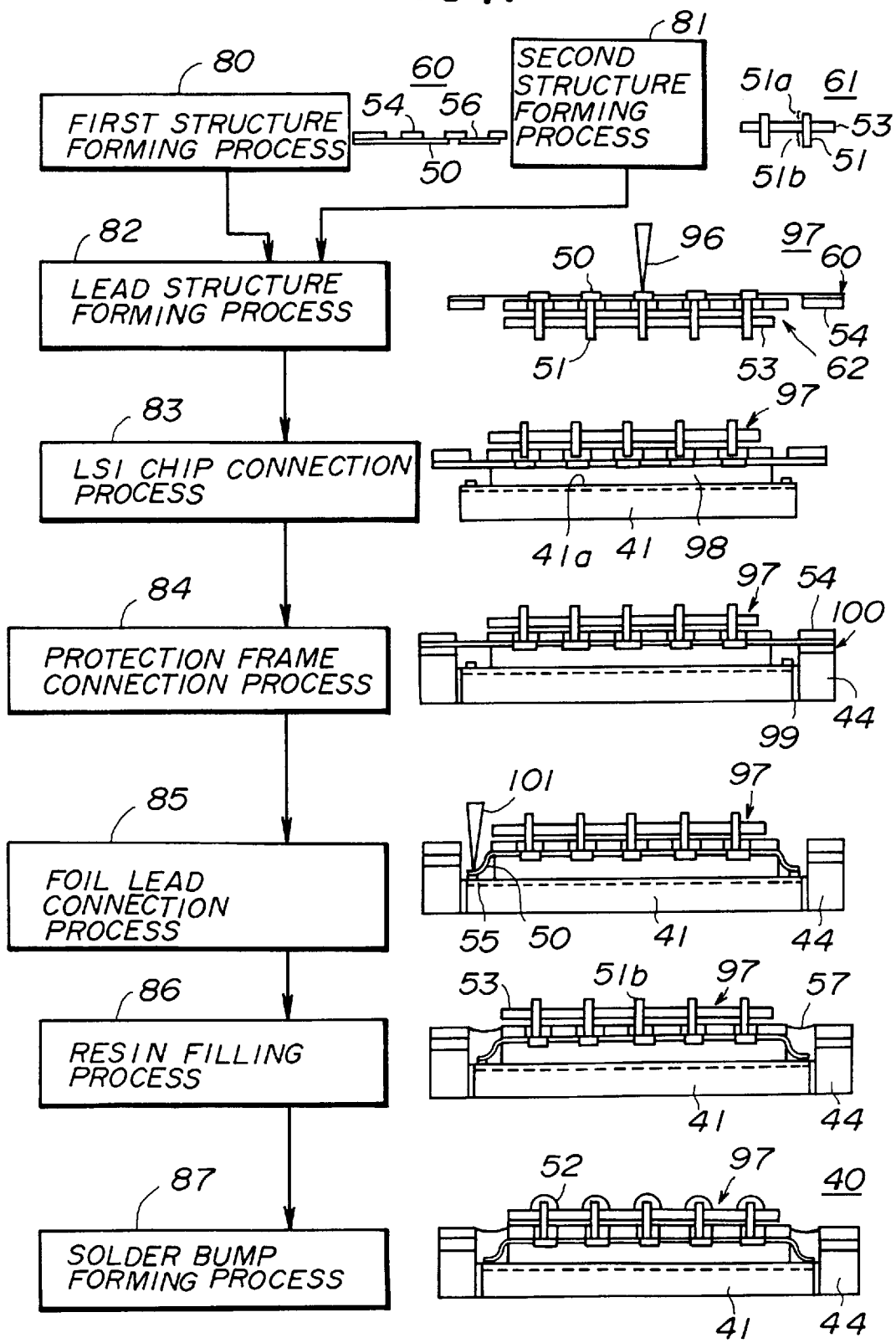
FIG. 7 is a process diagram illustrating a first method for manufacturing the μBGA semiconductor device shown in FIG. 4.

A first method for manufacturing the semiconductor device 40 is shown in FIG. 7.

In the first method, the first structure 60 of the lead structure and the second structure 61 thereof are separately formed, and both the structures 60 and 61 are then integrated with each other so that the lead structure is formed. After this, the LSI chip 41 is connected to the lead structure.

Referring to the FIG. 7, the first method includes a first structure forming process 80, a second structure forming process 81, a lead structure forming process 82, an LSI chip connection process 83, a protection frame connection process 84, a foil lead bonding process 85, a resin filling process 86 and a solder bump forming process 87.

Figure 1:
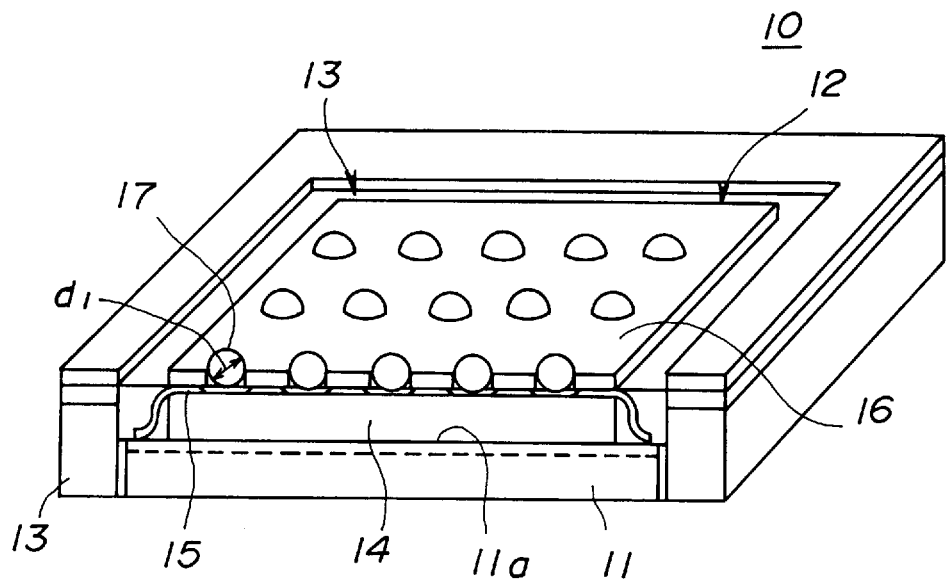
FIG. 1 is a diagram illustrating a structure of a conventional micro-semiconductor device.
Figure 2:
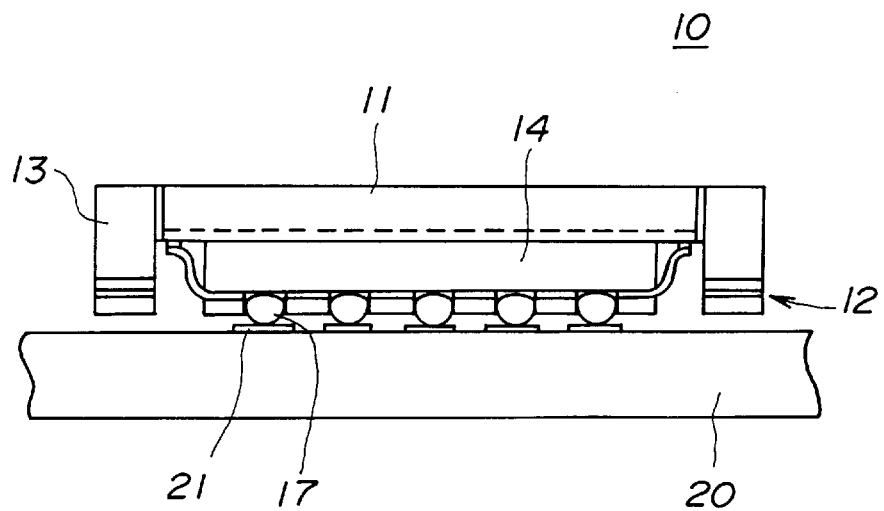
FIG. 2 is a cross-sectional view illustrating the conventional micro-semiconductor device mounted on a printed circuit board.
Figure 3:
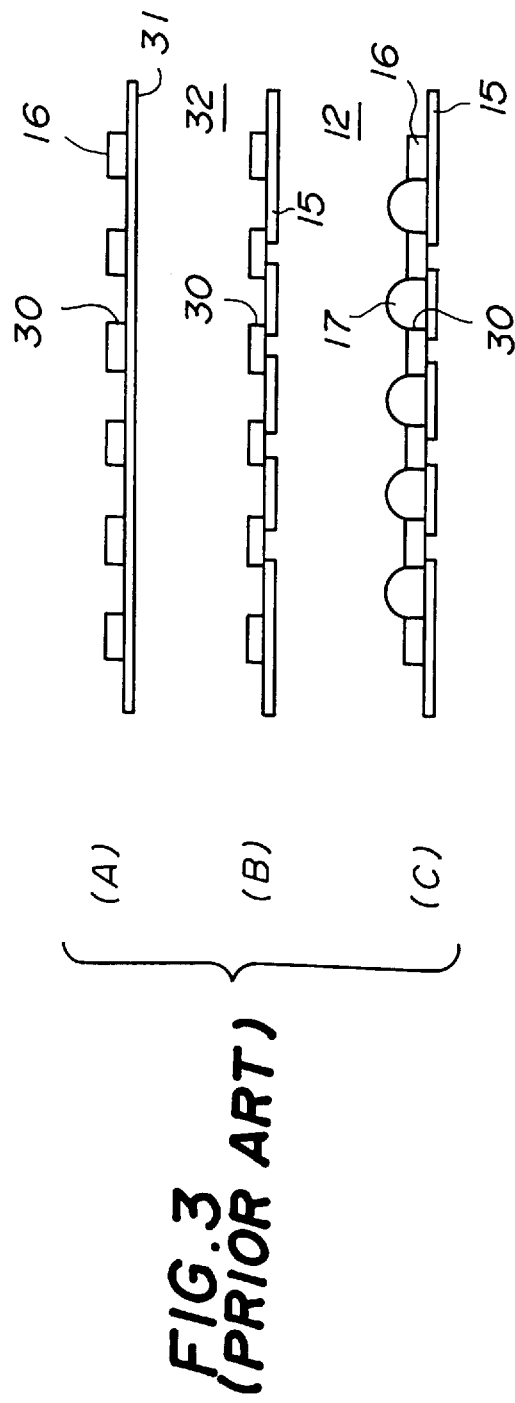
FIG. 3 is a diagram illustrating a conventional method for manufacturing a terminal member used in the conventional micro-semiconductor device.

In the first structure forming process 80, in the same manner as in the process shown in FIG. 3 (A) and (B), the Cu-foil is formed on the film 54 and the Cu-foil is etched so that the Cu-foil leads 50 are formed on the film 54. As a result, the first structure 60 in which the Cu-foil leads 50 are on the film 54 is formed.

Figure 8:
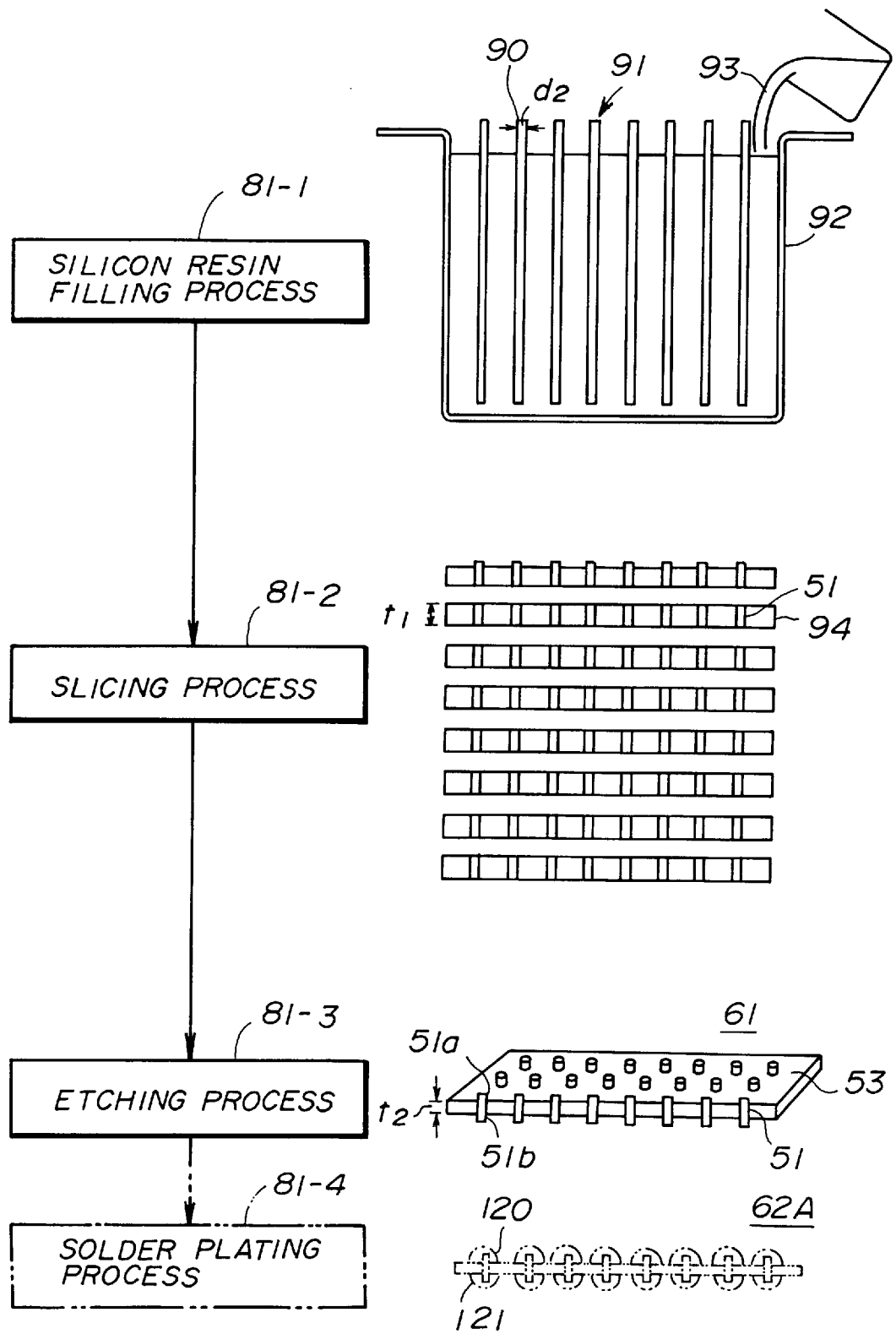
FIG. 8 is a diagram illustrating a lead structure forming process shown in FIG. 7.

In the second structure forming process 81, the second structure 61 is formed in accordance with a procedure as shown in FIG. 8. Referring to FIG. 8, this procedure includes a silicon resin filling process 81-1, a slicing process 81-2 and an etching process 82-3.

In the silicon resin filling process 81-1, an arranged wire group 91 in which many wires 90 are arranged in a matrix is set in a container 92 having a rectangular cross-section. The wires 90 are made of Cu and the diameter $d_2$ of each wire is 0.1 mm ($d_2$=0.1 mm). The container 92 in which the arranged wire group 91 is set is filled with silicon resin 93. The silicon resin 93 is hardened. The wires 90 are buried in the hardened silicon resin 93 so that relative positions of the wires 90 are fixed.

In the slicing process 81-2, after the silicon resin in the container 92 is hardened, a silicon block is removed from the container 92. The silicon block including the wires 90 is sliced in a direction perpendicular to a direction in which the wires 90 extend. Accordingly, silicon slices 94 each having a predetermined thickness $t_1$ (e.g. 1 mm) are obtained. The silicon block is sliced, and the wires 90 are divided so that the superfine pins 51 are arranged in each of the silicon slices 94.

After this, the etching process 81-3 is preformed.

In the etching process 81-3, each of the silicon slices 94 is etched so that both surface portions are dissolved and end portions of each of the superfine pins 51 project from surfaces of each of the silicon slices 94. AS a result, the second structure 61 is obtained.

The second structure 61 is formed of the base 53 which is made of silicon resin and has a thickness $t_2$ of about 0.5 mm and many superfine pins 51 each of which is made of Cu and has a diameter of about 0.3 mm and a length $l_1$ of about 0.1 mm. Each of the superfine pins 51 passes through the base 53 and the base 53 supports the superfine pins 51 at center portions of the superfine pins 51. In FIG. 8, the part projecting from the top surface of the base 53 is indicated as a top projection portion 51$a$, and the part projecting from bottom surface of the base 53 is indicated as a bottom projection portion 51$b$.

Returning to FIG. 7, in the lead structure forming process 82, the first structure 60 and the second structure 61 both of which have been obtained as described above are integrated with each other. The bottom projection portion 51$b$ of each of the superfine pins 51 enters the holes 56 of the film 54 so as to be in contact with the Cu-foil leads 50, as shown in FIG. 7. In this state, each of the Cu-foil leads 50 is bonded to a corresponding one of the superfine pins 51 by a thermocompression bonding process using a tool 96. As a result, the lead structure 97 in which the first structure 60 and the second structure 61 are integrated with each other is obtained.

In the LSI chip connection process 83, a softened adhesive 98 is put between a circuit surface 41a of the LSI chip 41 and a surface of the first structure 60 of the lead structure 97 on which surface the Cu-foil leads 50 are formed. As a result, the LSI chip 41 is connected to the lead structure 97.

In the protection frame connection process 84, the LSI chip 41 is connected to the protection frame 44 and adhered thereto by an adhesive 99. A circumferential portion of the film 54 is adhered to a top surface of the protection frame 44 by an adhesive 100.

In the foil lead bonding process 85, each of the Cu-leads 50 is connected to a corresponding one of the pads 55 using a tool 101.

In the resin filling process 86, the inside area bounded by the protection frame 44 is filled with resin so that the resin filled portion 57 is formed.

In the solder bump forming process 87, the surface of the second structure 61 of the lead structure 97 is plated with solder, so that the solder bumps 52 are formed on the bottom projection portions 51$b$ of the superfine pins 51. In this process 87, since the bottom projection portions 51b project from the base 53, the base 53 itself functions as a mask. Thus, the mask is not needed when the lead structure 97 is plated with solder. As a result, the solder bumps 54 can be stably formed on the ends (the bottom projection portions 51$b$) of the superfine pins 51.

When the solder bump forming process 87 is completed, the $\mu$BGA semiconductor device as shown in FIG. 4 is completely formed.

According to the first method described above, since the first structure 60 and the second structure 61 which are parts of the lead structure 97 are separately formed, the production of the first and second structures 60 and 61 do not depend on each other. In addition, since the Cu-foil leads 50 and the superfine pins 51 are bonded by the thermocompression bonding process, the first and second structures 60 and 61 are firmly integrated with each other. As a result, the lead structure 97 can be manufactured at a high rate of production, so that the production cost of the $\mu$BGA semiconductor device can be reduced.

A description will now be given, with reference to FIG. 9, of a first variation of the first method for manufacturing the $\mu$BGA semiconductor device.

Figure 9:
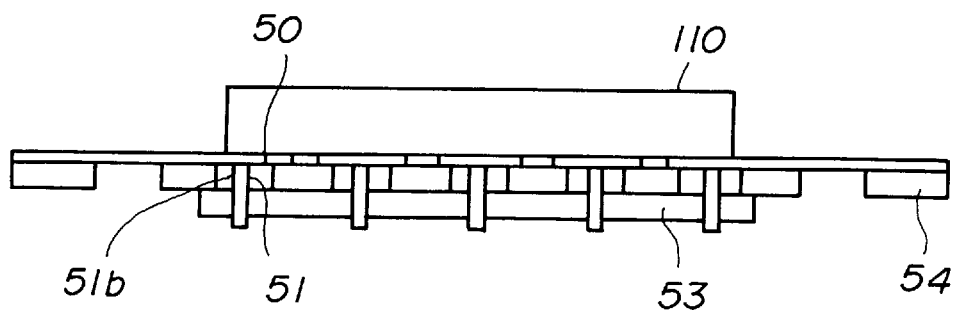
FIG. 9 is a diagram illustrating a variation of the lead structure.

In this variation, in the lead structure forming process 82, the first and second structures 60 and 61 are integrated with each other using a tool as shown in FIG. 9. That is, the Cu-foil leads 50 of the first structure 60 are collectively bonded to the downward projection portions 51$b$ of the superfine pins 51 of the second structure 61 by the thermocompression bonding process using the block-shaped tool 110.

Figure 10:
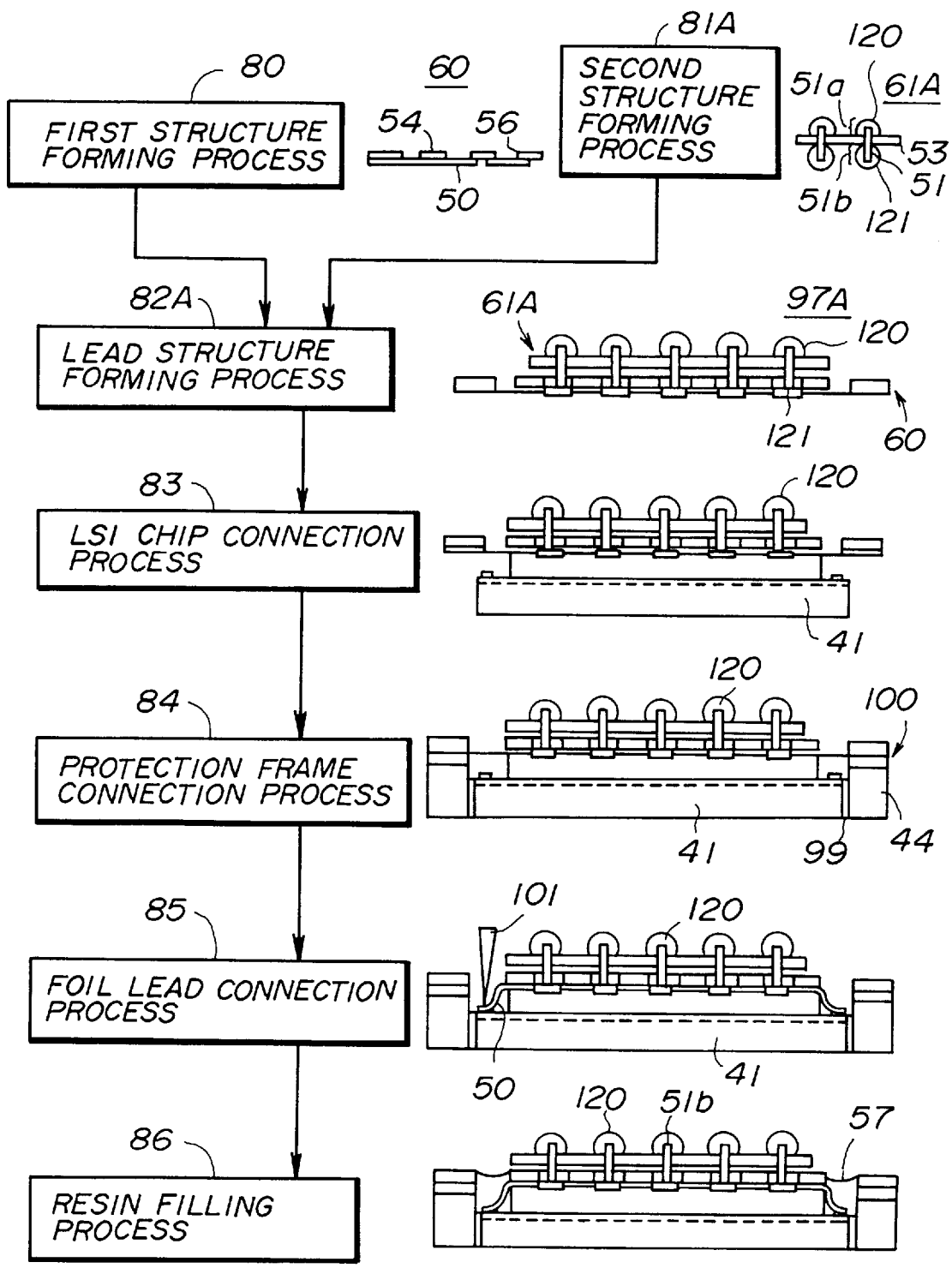
FIG. 10 a process diagram illustrating a variation of the first method for manufacturing the μBGA semiconductor device.

A description will now be given, with reference to FIG. 10, of a second variation of the first method described above. In FIG. 10, those parts which are the same as those shown in FIG. 7 are given the same reference numbers.

In this variation, the second structure forming process 81A and the lead structure forming process 82A differ from the corresponding structure forming processes shown in FIG. 7. In the second structure forming process 81A, a solder plating process 81-4 is additionally performed after the etching process 81-3 as indicated by a chain line in FIG. 8. Due to the solder plating process 81-4, solder is put on the upward and downward projection portions 51a and 51b of the superfine pins 51, so that solder bumps 120 and 121 are formed thereon. As a result, the second structure 61A having the solder bumps 120 and 121 which are provided on the upward and downward projection portions 51a and 51b of the superfine pins 51 is obtained.

In the lead structure forming process 82A, superfine pins 50 of the second structure 61A are bonded to the Cu-foil leads 50 of the first structure 60 by use of the solder bumps 121. As a result, a lead structure 97A on which the solder bumps 120 are formed is obtained.

After this, the LSI chip connection process 83, the protection frame connection process 84, the foil lead bonding process 85 and the resin filling process 86 are successively performed in the same manner as in the case shown in FIG. 7. However, in this case, since the solder bumps 120 have been formed on the second structure in the second structure forming process 81A, the solder bump forming process 86 to be performed after the resin filling process 86 as shown in FIG. 7 is omitted.

A description will now be given, with reference to FIG. 11, of a second method for manufacturing the μBGA semiconductor device. In FIG. 11, those parts which are the same as those shown in FIGS. 7 and 10 are given the same reference numbers.

In the second method, the first and second structures 60 and 61A of the lead structure 42 are separately formed, the LSI chip 41 is bonded to the first structure 60 and the second structure 61A is then bonded to the first structure 60.

Referring to FIG. 11, the first structure 60 and the second structure 61A are separately formed in the first structure forming process 80 and the second structure forming process 82A.

In a protection frame connection process 84A, the adhesive layer 43 is adhered to the circuit surface 41a of the LSI chip 41. The LSI chip 41 having the circuit surface 41a covered by the adhesive layer 43 is set in and then connected to the protection frame 44.

In the LSI chip connection process 83A, the first structure 60 of the lead structure is adhered to the adhesive layer 43 and the protection frame 44, so that the LSI chip 41 connected to the protection frame 44 is integrated with the first structure 60.

In the foil lead bonding process 85, the Cu-foil leads 50 of the first structure 60 are bonded to the pads of the LSI chip 41 in the same manner as in the process shown in FIG. 7.

In the resin filling process 86, the inside area bounded by the protection frame 44 is filled with the resin so that the resin filled portion 57 is formed, in the same manner as in the process shown in FIG. 7.

After the resin filling process 86, a paste printing process 130 is performed. In the paste printing process 130, soldering paste 135 is printed on the surface of the first structure 60 provided with the LSI chip 41. The soldering paste 135 fills the holes 56 formed on the film 54 so as to cover the Cu-foil leads 50.

After the paste printing process 130, a structure connection process 131 is performed. In the structure connection process 131, the superfine pins 51 of the second structure 61A obtained in the process 81A are bonded to the Cu-foil leads 50 of the first structure 60 by use of the soldering paste 135 and the solder bumps 121.

According to the second method, the μBGA semiconductor device can be simply manufactured and the rate of production thereof can be increased.

A description will now be given, with reference to FIGS. 12A–12F and FIGS. 13A–13F, of variations of the second structure to be bonded to the first structure.

Figure 12A:
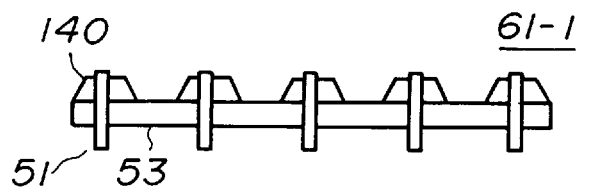
FIGS. 12A, 12B, 12C, 12D, 12E, 12F and 12G are diagrams illustrating variations of the lead structure.

A second structure 61-1 shown in FIG. 12A has conductive paste bumps 140 provided on projection portions of the superfine pins 51 in a side of the base 53.

Figure 12B:
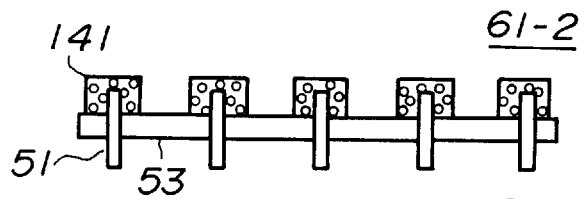

A second structure 61-2 shown in FIG. 12B has anisotropic pieces 141 provided on projection portions of the superfine pins 51 in a side of the base 53. Each of the anisotropic pieces 141 normally has an insulating property in any direction, but has a conductive property in a direction of compression when being compressed.

Figure 12C:
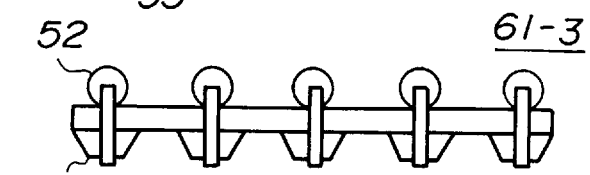

A second structure 61-3 shown in FIG. 12C has the solder bumps 52 and the conductive paste bumps 140, respectively, provided on projection portions of the superfine pins 51 on opposite sides of the bases 53.

Figure 12D:
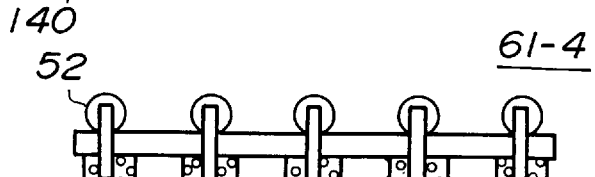

A second structure 61-4 shown in FIG. 12D has the solder bumps 52 and the anisotropic pieces 141 respectively provided on projection portions of the superfine pins 51 on opposite sides of the bases 53.

Figure 12E:
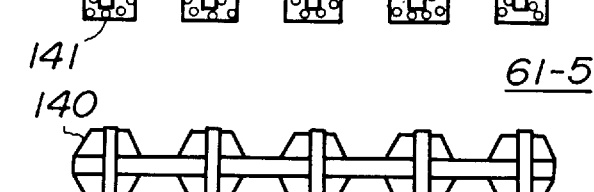

A second structure 61-5 shown in FIG. 12E has the conductive paste bumps 140 provided on projection portions of the superfine pins 51 on the both sides of the bases 53.

Figure 12F:
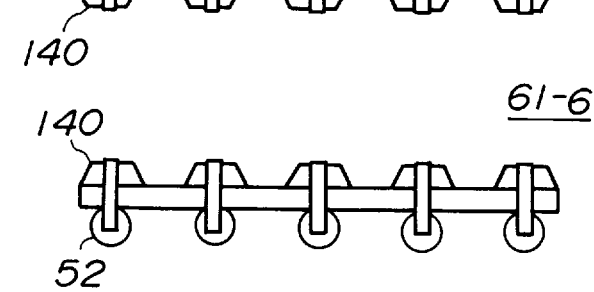

A second structure 61-6 shown in FIG. 12F has the conductive paste bumps 140 and the solder bumps 52 respectively provided on projection portions of the superfine pins 51 on sides of the base 53 opposite to that shown in FIG. 12C.

Figure 12G:
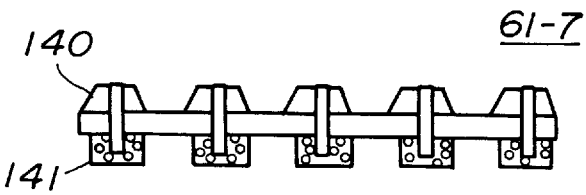

A second structure 61-7 shown in FIG. 12G has the conductive paste bumps 140 and the anisotropic pieces 141 respectively provided on projection portions of the superfine pins 51 on opposite sides of the base 53.

Figure 13A:
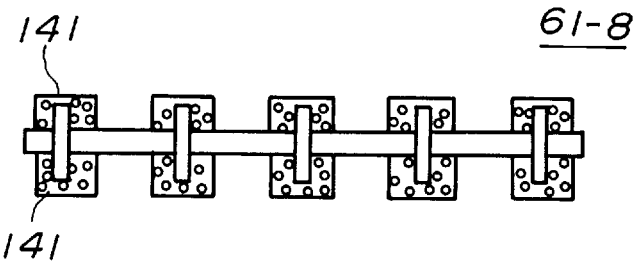
FIGS. 13A, 13B, 13C, 13D, 13E and 13F are diagrams illustrating other variations of the lead structure.

A second structure 61-8 shown in FIG. 13A has anisotropic pieces 141 provided on projection portions of the superfine pins 51 on both sides of the base 53.

Figure 13B:
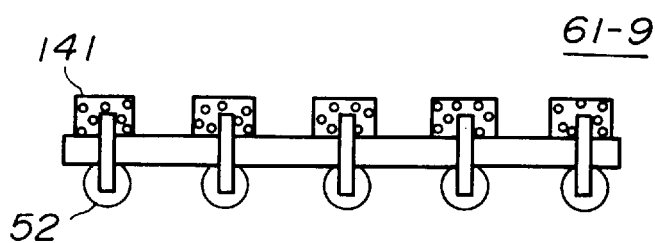

A second structure 61-9 shown in FIG. 13B has the anisotropic pieces 141 and the solder bumps 52 respectively provided on projection portions of the superfine pins 51 on opposite sides of the base 53 as compared to FIG. 12D.

Figure 13C:
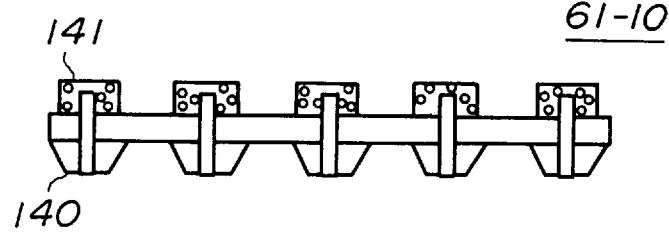

A second structure 61-10 shown in FIG. 13C has the anisotropic pieces 141 and the conductive paste bumps 140 respectively provided on projection portions of the superfine pins 51 on opposite sides of the base 53.

Figure 13D:
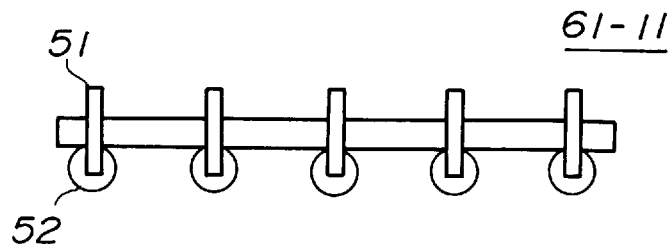

A second structure 61-11 shown in FIG. 13D has the solder bumps 52 provided on projection portions of the superfine pins 51 on only one side of the base 53.

Figure 13E:
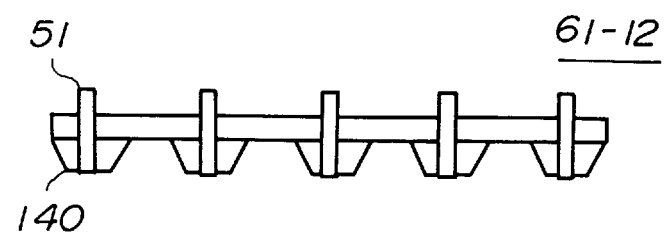

A second structure 61-12 shown in FIG. 13E has the conductive paste bumps 140 provided on projection portions of the superfine pins 51 on only one side of the base 53.

Figure 13F:
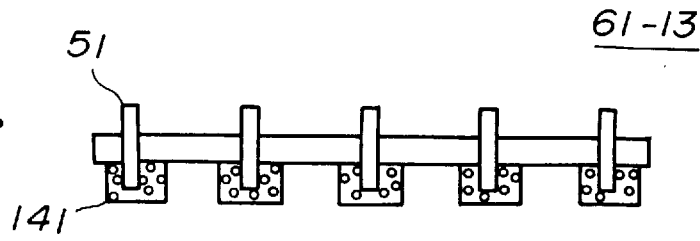

A second structure 61-13 shown in FIG. 13F has the anisotropic pieces 141 provided on projection portions of the superfine pins 51 on only one side of the base 53.

Figure 14A:
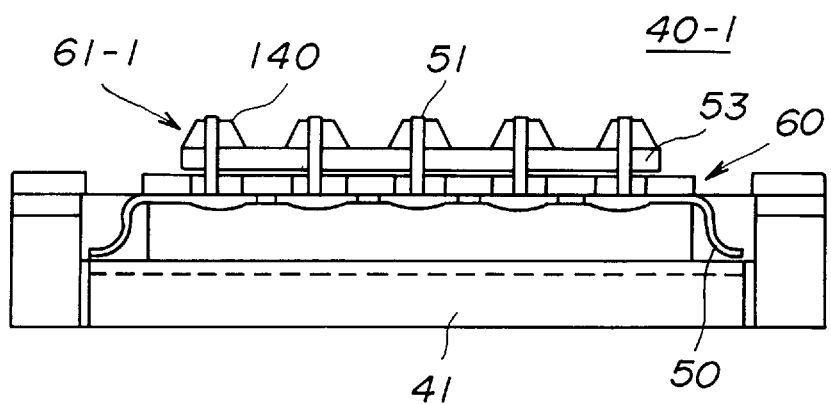
FIG. 14A and 14B are diagrams illustrating variations of the μBGA semiconductor device.

The second structure 61-1 shown in FIG. 12A is bonded to the first structure 60 as shown in FIG. 14A. That is, projection portions of the superfine pins 51 projecting from a side of the base 53 are bonded to the Cu-foil leads 50 of the first structure 60 by the thermocompression bonding process. As a result, a semiconductor device 40-1 from which superfine pins 51 provided with the conductive paste bumps 140 project as shown in FIG. 14A is obtained.

Figure 14B:
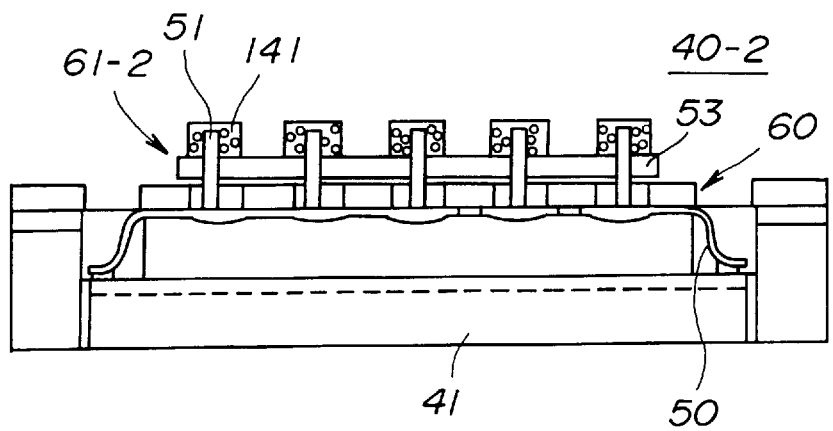

The second structure 61-2 shown in FIG. 12B is bonded to the first structure 60 as shown in FIG. 14B. That is, projection portions of the superfine pins 51 projecting from a side of the base 53 are bonded to the Cu-foil leads 50 of the first structure 60 by the thermocompression bonding process. As a result, a semiconductor device 40-2 from which superfine pins 51 provided with the anisotropic pieces 141 project as shown in FIG. 14B is obtained.

Figure 15A:
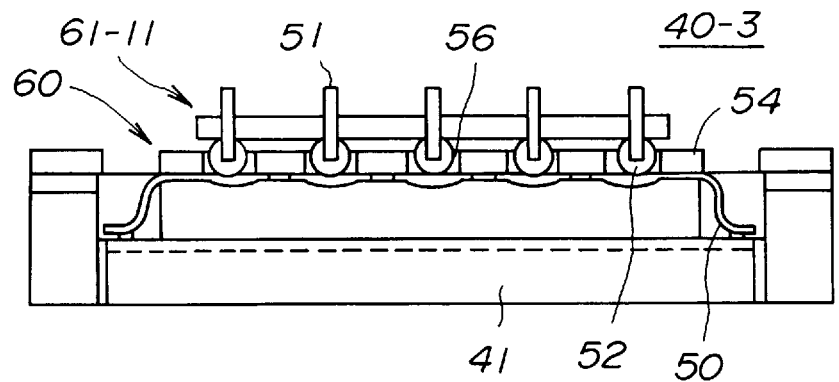
FIGS. 15A, 15B and 15C are diagrams illustrating other variations of the μBGA semiconductor device.

The second structure 61-11 shown in FIG. 13D is bonded to the first structure 60 as shown in FIG. 15A. That is, the projection portions of the superfine pins 51 are inserted into the holes 56 of the film 54 so that the solder bumps 52 are set in the holes 56, and the superfine pins 51 are then bonded to the Cu-foil leads 50 of the first structure 60 by use of the solder bumps 52. As a result, a semiconductor device 40-3 from which the superfine pins 51 project as shown in FIG. 15A is obtained.

Figure 15B:
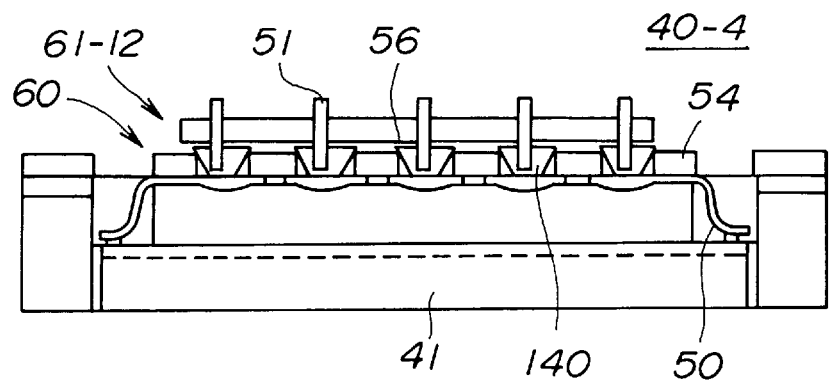

The second structure 61-12 shown in FIG. 13E is bonded to the first structure 60 as shown in FIG. 15B. That is, the projection portion of the superfine pins 51 are inserted into the holes 56 of the film 54 so that the conductive paste bumps 140 are set in the holes 56, and the superfine pins 51 are then bonded to the Cu-foil leads 50 of the first structure 60 by the thermocompression bonding process. As a result, a semiconductor device 40-4 from which the superfine pins 51 project as shown in FIG. 15B is obtained.

Figure 15C:
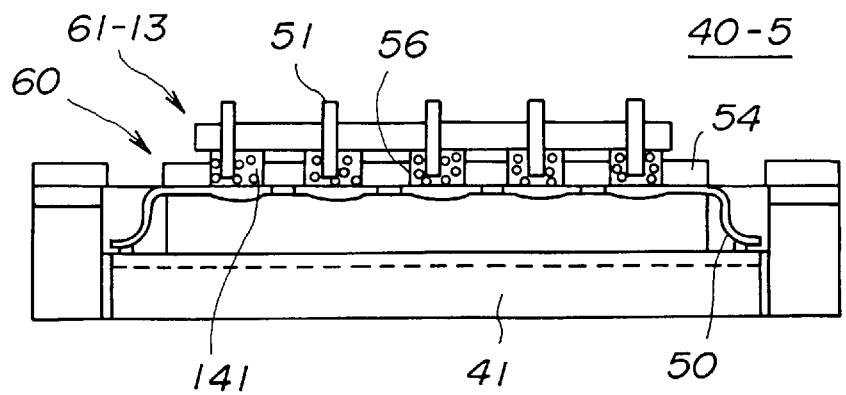

The second structure 61-13 shown in FIG. 13F is bonded to the first structure as shown in FIG. 15C. That is, the projection portion of the superfine pins 51 are inserted into the holes 56 of the film 54 so that the anisotropic pieces 141 are set in the holes 56, and the superfine pins 51 are then bonded to the Cu-foil leads 50 of the first structure 60 by the thermocompression bonding process. As a result, a semiconductor device 40-5 from which the superfine pins 51 project as shown in FIG. 15C is obtained.

A description will now be given, with reference to FIG. 16, of a semiconductor device according to a second embodiment of the present invention.

Figure 16:
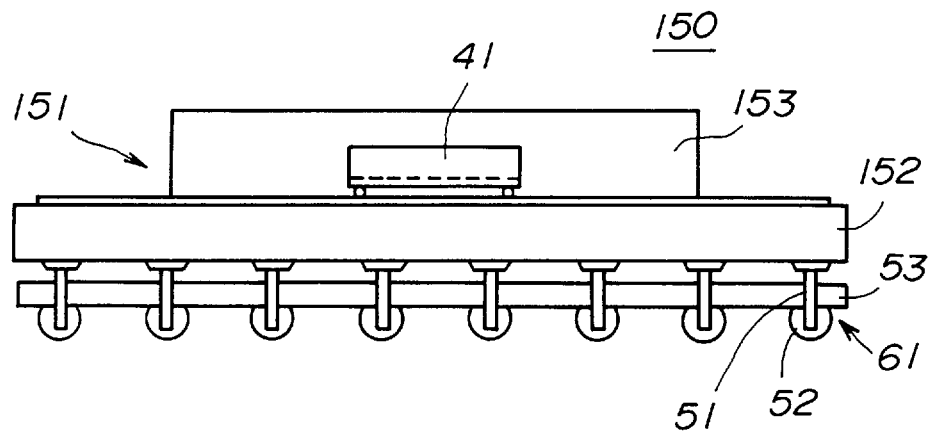
FIG. 16 is a diagram illustrating a semiconductor device according to a second embodiment of the present invention.

Referring to FIG. 16, a semiconductor device 150 is a general BGA type. The semiconductor device 150 is formed of a device body 151 and a lead structure 61. The device body 151 has a circuit substrate 152 on which a circuit pattern is formed and the LSI chip 41 mounted on the circuit substrate 152. The LSI chip 41 is encapsulated in a resin package 153. The lead structure 61 corresponds to the second structure described above. That is, the superfine pins 51 project from both sides of the base 53 and the projection portions of the superfine pins 51 are provided with solder bumps 52 on a side of the base 53. Ends of the pins 51 are bonded to pads on a surface of the circuit substrate 152 which surface is opposite to the surface having the circuit pattern.

A description will now be given, with reference to FIG. 17, of a semiconductor device according to a third embodiment of the present invention.

Figure 17:
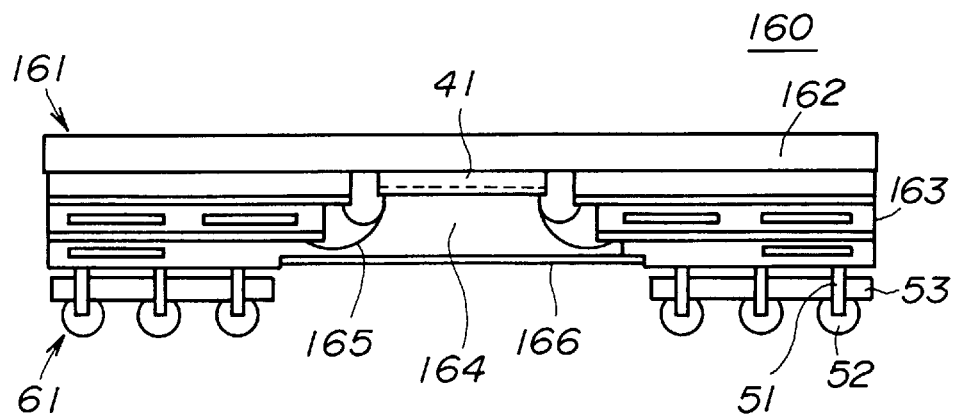
FIG. 17 is a diagram illustrating a semiconductor device according to a third embodiment of the present invention.

Referring to FIG. 17, a semiconductor device 160 is a general BGA type. The semiconductor device 160 is formed of a device body 161 and the lead structure 61. The device body 161 has a metal plate 162 functioning as a radiator, a circuit substrate 163 and the LSI chip 41. The circuit substrate 163 has a rectangular frame-shaped structure and is connected to a surface of the metal plate 162. The LSI chip 41 is bonded in an area surrounded by the circuit substrate 163 on the surface of the metal plate 162. The LSI chip 41 is electrically connected to the circuit substrate 163 by wires 165 bonded to the LSI chip 41 and the circuit substrate 163. A metal lid 166 covers a space 164 surrounded by the circuit substrate 163 so that the LSI chip 1 is encapsulated. The lead structure 61 has the same structure as that shown in FIG. 16, and is bonded to a surface of the circuit substrate 163.

A description will now be given, with reference to FIG. 18, of a semiconductor device according to a fourth embodiment of the present invention.

Figure 18:
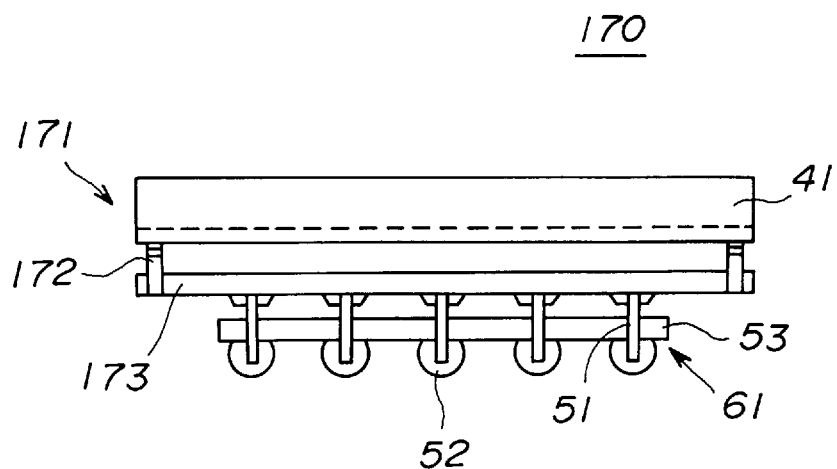
FIG. 18 a diagram illustrating a semiconductor device according to a fourth embodiment of the present invention.

Referring to FIG. 18, a semiconductor device 170 is a $\mu$BGA type. The semiconductor device 170 is formed of a device body 171 and the lead structure 61. The device body 171 has a circuit substrate 173 on which a circuit pattern is formed and the LSI chip 41. The LSI chip 41 is connected to the circuit substrate 173 by metal pins 172 which project from a circumference of the circuit substrate 173. The lead structure 61 is the same as the second structure described above. Ends of the superfine pins 51 are bonded to pads on the circuit substrate 173. As a result, the semiconductor device 170, from which the superfine pins 51 provided with the solder bumps 52 project as shown in FIG. 18, is obtained.

The present invention is not limited to the aforementioned embodiments, and variations and modifications may be made without departing from the scope of the claimed invention.

What is claimed is:

1. A semiconductor device comprising:
    a device body including an LSI chip and a softened adhesive layer with which said LSI chip is covered; and
    a lead structure having a base which is flexible and a plurality of pins which pass through said base and project from both sides of said base, said lead structure being integrated with said device body so that first ends of said plurality of pins are supported by said softened adhesive layer and electrically connected to said LSI chip.

2. The semiconductor device as claimed in claim 1 further comprising:
    conductive bumps provided on second ends of said plurality of pins.

3. The semiconductor device as claimed in claim 2, wherein said conductive bumps are of metal.

4. The semiconductor device as claimed in claim 2, wherein said conductive bumps are conductive paste.

5. The semiconductor device as claimed in claim 1 further comprising:
    anisotropic pieces provided on second ends of said plurality of pins, each of said anisotropic pieces normally having an insulating property in any direction, and having a conducting property in a direction of compression when being compressed.

6. The semiconductor device as claimed in claim 1, wherein said base is formed of silicon resin.

7. The semiconductor device as claimed in claim 1 further comprising:
    conductive material provided on the first ends of said plurality of pins so as to be electrically connected to said LSI chip.

8. The semiconductor device as claimed in claim 7, wherein said conductive material is metal.

9. The semiconductor device as claimed in claim 7, wherein said conductive material is conductive paste.

10. The semiconductor device as claimed in claim 1 further comprising:
    anisotropic material provided on the first ends of said plurality of pins so as to be electrically connected to said LSI chip, each of said anisotropic pieces normally having an insulating property in any directions, and having a conducting property in a direction of compression when being compressed.

* * * * *